(12) United States Patent
Hattori et al.

(10) Patent No.: US 8,952,766 B2
(45) Date of Patent: Feb. 10, 2015

(54) CONTROL BOARD, INVERTER DEVICE AND INTEGRATED-INVERTER ELECTRIC COMPRESSOR

(75) Inventors: Makoto Hattori, Tokyo (JP); Masahiko Asai, Tokyo (JP)

(73) Assignee: Mitsubishi Heavy Industries, Ltd., Tokyo (JP)

(*) Notice: Subject to any disclaimer, the term of this patent is extended or adjusted under 35 U.S.C. 154(b) by 380 days.

(21) Appl. No.: 13/386,287

(22) PCT Filed: Dec. 20, 2010

(86) PCT No.: PCT/JP2010/072904
§ 371 (c)(1),
(2), (4) Date: Jan. 20, 2012

(87) PCT Pub. No.: WO2011/078123
PCT Pub. Date: Jun. 30, 2011

(65) Prior Publication Data
US 2012/0119688 A1 May 17, 2012

(30) Foreign Application Priority Data
Dec. 25, 2009 (JP) ................................. 2009-296158

(51) Int. Cl.
*H02K 11/02* (2006.01)
*H02M 7/00* (2006.01)
(Continued)

(52) U.S. Cl.
CPC ......... *H02K 11/0073* (2013.01); *H03H 1/0007* (2013.01); *H02M 7/003* (2013.01)
USPC ................................. 333/12; 333/185; 363/37

(58) Field of Classification Search
CPC ... H02K 11/0073; H02K 11/02; H02M 7/003; H02M 7/00; H04B 15/02; H03H 1/0007
USPC ........ 333/12, 24 C, 185; 363/37, 39, 34, 154; 439/55
See application file for complete search history.

(56) References Cited

U.S. PATENT DOCUMENTS 4,356,480 A * 10/1982 Dressler ........................ 340/620
5,675,223 A 10/1997 Yoshizawa et al.
(Continued)

FOREIGN PATENT DOCUMENTS

JP 8-322264 A 12/1996
JP 2003-289675 A 10/2003
(Continued)

OTHER PUBLICATIONS

A Decision to Grant a Patent dated Dec. 3, 2013, issued in corresponding Japanese Patent Applicatipn No. 2009-296158. The Decision to Grant a Patent has been received (3 pages).
(Continued)

*Primary Examiner* — Benny Lee
*Assistant Examiner* — Jorge Salazar, Jr.
(74) *Attorney, Agent, or Firm* — Western, Hattori, Daniels & Adrian, LLP

(57) ABSTRACT

An object is to provide a control board, an inverter device, and an integrated-inverter electric compressor that are capable of improving electromagnetic compatibility (EMC property) and improving reliability against input/output of electromagnetic noise, which shows a tendency towards greater complexity and intensity. A control board to which two power systems, that is, a low-voltage power system and a high-voltage power system, are inputs, comprising a low-voltage circuit and a high-voltage circuit, and a low-voltage-side ground region and a high-voltage-side ground region that are formed in correspondence with the circuits, respectively, wherein frame ground regions are provided at a plurality of positions on the control board, and a plurality of communication line patterns connected to the low-voltage circuit are respectively connected to both the low-voltage-side ground region and the frame ground region through capacitance elements with various capacitances.

19 Claims, 4 Drawing Sheets

(51) Int. Cl.
*H03H 1/00* (2006.01)
*H02K 11/00* (2006.01)

(56) References Cited

U.S. PATENT DOCUMENTS

| | | |
|---|---|---|
| 7,534,109 B2 * | 5/2009 | Hattori et al. .................. 439/55 |
| 2003/0182956 A1 | 10/2003 | Kurita et al. |
| 2004/0194486 A1 | 10/2004 | Kurita et al. |
| 2008/0087458 A1 | 4/2008 | Hattori et al. |
| 2010/0170294 A1 | 7/2010 | Nakagami et al. |
| 2010/0284838 A1 | 11/2010 | Ichise et al. |

FOREIGN PATENT DOCUMENTS

| | | |
|---|---|---|
| JP | 2008-099480 A | 4/2008 |
| JP | 2009-089511 A | 4/2009 |
| JP | 2009-207310 A | 9/2009 |

OTHER PUBLICATIONS

International Search Report of PCT/JP2010/072904, mailing date Mar. 1, 2011.

* cited by examiner

CONTROL BOARD, INVERTER DEVICE AND INTEGRATED-INVERTER ELECTRIC COMPRESSOR

The present application claims priority to 371 PCT Patent Application PCT/JP2010/072904 filed on Dec. 20, 2009.

TECHNICAL FIELD

The present invention relates to a control board suitable for an inverter device, to an inverter device using the same, and to an integrated-inverter electric compressor in which the inverter device is integrated.

BACKGROUND ART

Air conditioners installed in electric vehicles, hybrid vehicles, and so forth employ integrated-inverter electric compressors in which inverter devices are integrally built in. These integrated-inverter electric compressors are configured such that an inverter device, which converts DC power supplied from the on-board power to three-phase AC power, is integrally built into a housing of the electric compressor, and the compressor is driven by applying three-phase AC power converted by the inverter device to an electric motor accommodated in the housing.

Two power systems, a high-voltage power system for rotationally driving the electric motor and a low-voltage power system for control and communication, are connected to the inverter device. A control board used for the inverter device is configured so as to be correspondingly partitioned into a region in which a low-voltage circuit pattern is provided and a region in which a high-voltage circuit pattern is provided and so as to have a respective low-voltage-side ground region and a high-voltage-side ground region formed correspondingly to the circuit regions (for example, see PTLs 1 and 2).

In addition, because power lines, communication lines, and so forth are connected to the inverter device, electromagnetic noise is radiated from the outside through these lines. Because the inverter device includes high-voltage electronic components, such as semiconductor switching elements etc., the inverter device itself serves as a source of electromagnetic noise. In order to reduce the input/output of such electromagnetic noise, PTL 1 discloses a control board and a control device in which a patterned low-voltage-side ground is directly grounded to the casing (frame), a high-voltage-side ground is grounded to the casing (frame) through a capacitance element, such as a capacitor etc., and the low-voltage-side ground region and the high-voltage-side ground region are connected through the capacitor.

CITATION LIST

Patent Literature

{PTL 1} Japanese Unexamined Patent Application, Publication No. 2008-99480 (see FIG. 2)
{PTL 2} Japanese Unexamined Patent Application, Publication No. 2009-89511 (see FIG. 5)

SUMMARY OF INVENTION

Technical Problem

However, inverter devices have been increasingly reduced in size, and along with this trend, control boards used in inverter modules have also been increasingly reduced in size and increased in density. In addition, other than power lines and ground lines, about six communication-related input/output lines are connected to some inverter modules, and there is a trend towards an increasing number of input/output lines. Therefore, with an inverter device to which two power systems are connected, the generation of noise and transmission routes of electromagnetic noise become more complex, and the noise itself tends to grow; accordingly, it has become difficult to achieve electromagnetic compatibility (EMC; Electro-Magnetic Compatibility) with the configuration disclosed in PTL 1.

The present invention has been conceived in light of the above-described circumstances, and an object thereof is to provide a control board, an inverter device, and an integrated-inverter electric compressor that are capable of improving electromagnetic compatibility (EMC properties) and of improving reliability against input/output of electromagnetic noise, which is showing a tendency to become more complicated and more intense.

Solution to Problem

In order to solve the problems described above, a control board, an inverter device, and an integrated-inverter electric compressor according to the present invention employ the following solutions.

That is, a control board according to a first aspect of the present invention is a control board to which two power systems, a low-voltage power system and a high-voltage power system, are input, comprising a low-voltage circuit and a high-voltage circuit, and a low-voltage-side ground region and a high-voltage-side ground region that are formed in correspondence with the circuits, respectively, wherein frame ground regions are provided at a plurality of positions on the control board, and a plurality of communication line patterns connected to the low-voltage circuit are respectively connected to both the low-voltage-side ground region and the frame ground regions through capacitance elements with various capacitances.

According to the first aspect of the present invention, the frame ground regions are provided at a plurality of positions on the control board, and a plurality of the communication line patterns connected to the low-voltage circuit are respectively connected to both the low-voltage-side ground region and the frame ground regions through the capacitance elements with various capacitances. Therefore, it is possible to stabilize the low-voltage circuit in terms of noise by reducing the electromagnetic noise in various frequency bands that is input/output through a plurality of communication lines by pulling down the electromagnetic noise to the low-voltage-side ground region and the frame ground regions through the capacitance elements having various capacitances. Thus, it is possible to improve the electromagnetic compatibility (EMC; Electro-Magnetic Compatibility) of the control board and to increase the reliability against increasing complexity, intensity, etc. of generated noise and noise transmission routes due to the properties of the control board, size-reduction of the control board, an increase in the number of communication lines, and so forth.

Furthermore, in the control board according to the first aspect of the present invention, for the above-described control board, the capacitance elements that are connected between the plurality of communication line patterns and the frame ground region may have capacitances of 0.1 μF or more, and the capacitance elements that are connected between the communication line patterns and the low-voltage-side ground region may have capacitances of pF order.

According to the first aspect of the present invention, the capacitance elements that are connected between the communication line patterns and the frame ground regions have capacitances of 0.1 µF or more, and the capacitance elements that are connected between the communication line patterns and the low-voltage-side ground region have capacitances of pF order. Therefore, the conductive noise is mainly pulled down to the frame ground region through the capacitance elements that have a capacitance of 0.1 µF or more and that are connected to the frame ground regions, and the radiated noise is mainly pulled down to the low-voltage-side ground region through the capacitance elements that have a capacitance of pF order and that are connected to the low-voltage-side ground region; by doing so, the noise can be reduced in a wide frequency band. Therefore, the control board can be made compliant with several noise tests, and it is possible to improve the EMC properties of the control board.

Furthermore, in the control board according to the first aspect of the present invention, for any of the above-described control boards, the plurality of communication line patterns may be connected to the frame ground region that is located closest to connecting positions of the communication lines through the capacitance elements.

According to the first aspect of the present invention, the communication line patterns are connected to the frame ground region that is located closest to the connecting positions of the communication lines through the capacitance elements. Therefore, it is possible to pull down the electromagnetic noise to the frame ground region at a location closer to the generation source and to reduce the electromagnetic noise more effectively. Therefore, it is possible to further improve the EMC properties of the control boards.

Furthermore, in the control board according to the first aspect of the present invention, for any of the above-described control boards, the ground line may be connected to the low-voltage-side ground region, and the ground line is connected to one of the frame ground regions through the capacitance element having a capacitance of 0.1 µF or more.

According to the first aspect of the present invention, the ground line is connected to the low-voltage-side ground region, and the ground line is connected to one of the frame ground regions through the capacitance element having a capacitance of 0.1 µF or more. Therefore, it is possible to reduce the electromagnetic noise input from and output to the low-voltage-side ground region through the ground line by pulling down the electromagnetic noise to the frame ground regions through the capacitance elements; thereby, it is possible to improve the EMC properties of the control board.

Furthermore, in the control board according to the first aspect of the present invention, for any of the above-described control boards, the low-voltage-side ground region may be connected to one of the frame ground regions through a capacitance element having a capacitance of 0.1 µF or more.

According to the first aspect of the present invention, the low-voltage-side ground region is connected to one of the frame ground regions through the capacitance element having a capacitance of 0.1 µF or more. Therefore, it is possible to ground the low-voltage-side ground region to the frame ground region through the capacitance element having a capacitance of 0.1 µF or more, to reduce the electromagnetic noise in the low-voltage-side ground region by pulling down the electromagnetic noise to the frame ground region, and to stabilize the low-voltage circuit in terms of noise. Therefore, it is possible to improve the EMC properties of the control board and to increase the reliability.

Furthermore, in the control board according to the first aspect of the present invention, for the above-described control board, the low-voltage-side ground region may be connected to the frame ground region that is located closest to that low-voltage-side ground region through one of the capacitance elements.

According to the configuration of the first aspect of the present invention mentioned above, the low-voltage-side ground region is connected to the frame ground region that is located closest to the low-voltage-side ground region through one of the capacitance elements. Therefore, it is possible to ground the low-voltage-side ground region to the frame ground region that is located closest thereto through the capacitance element having a capacitance of 0.1 µF or more and to reduce the electromagnetic noise in the low-voltage-side ground region by readily pulling down the electromagnetic noise to the frame ground region. Therefore, it is possible to stabilize the low-voltage circuit in terms of noise and to improve the EMC properties of the control board.

Furthermore, the control board according to the first aspect of the present invention, for any of the above-described control boards, the high-voltage-side ground region may be connected to at least one of the frame ground regions through capacitance elements having a capacitance of 10,000 pF or more.

According to the first aspect of the present invention, the high-voltage-side ground region is connected to at least one of the frame ground regions through the capacitance elements having a capacitance of 10,000 pF or more. Therefore, it is possible to ground the high-voltage-side ground region to at least one of the plurality of frame ground regions through the capacitance elements having a capacitance of 10,000 pF or more, to reduce the electromagnetic noise entering the high-voltage-side ground region by pulling down the electromagnetic noise to the frame ground region that is located closest thereto, and to stabilize the high-voltage circuit in terms of noise. Therefore, it is possible to improve the EMC properties of the control board and to increase reliability.

Furthermore, in the control board according to the first aspect of the present invention, for the above-described control board, the high-voltage-side ground region may be connected to the frame ground region that is located closest to that high-voltage-side ground region through the capacitance element.

According to the configuration of the first aspect of the present invention mentioned above, the high-voltage-side ground region is connected to the frame ground region that is located closest to that high-voltage-side ground region through the capacitance element. Therefore, it is possible to ground the high-voltage-side ground region to the frame ground region that is located closest thereto through the capacitance element having a capacitance of 10,000 pF or more and to reduce the electromagnetic noise entering the high-voltage-side ground region by readily pulling down the electromagnetic noise to the frame ground region. Therefore, it is possible to stabilize the high-voltage circuit in terms of noise and to improve the EMC properties of the control board.

Furthermore, a control board according to a second aspect of the present invention is a control board to which two power systems, a low-voltage power system and a high-voltage power system, are input, comprising a low-voltage circuit and a high-voltage circuit, and a low-voltage-side ground region and a high-voltage-side ground region that are formed in correspondence with the circuits, respectively, wherein frame ground regions are provided at a plurality of positions on the control board, and the low-voltage-side ground region is connected to one of the frame ground regions through a capacitance element having a capacitance of 0.1 µF or more.

According to the second aspect of the present invention, the frame ground regions are provided at a plurality of positions on the control board, and the low-voltage-side ground region is connected to one of the frame ground regions through the capacitance element having a capacitance of 0.1 µF or more. Therefore, it is possible to ground the low-voltage-side ground region to the frame ground region through the capacitance element having a capacitance of 0.1 µF or more, to reduce mainly the conductive noise by readily pulling down the electromagnetic noise entering the low-voltage-side ground region to the frame ground region, and to stabilize the low-voltage circuit in terms of noise. Therefore, it is possible to improve the EMC properties of the control board and to increase reliability.

Furthermore, a control board according to a third aspect of the present invention is a control board to which two power systems, a low-voltage power system and a high-voltage power system, are input, comprising a low-voltage circuit and a high-voltage circuit, and a low-voltage-side ground region and a high-voltage-side ground region that are formed in correspondence with the circuits, respectively, wherein frame ground regions are provided at a plurality of positions on the control board, and the high-voltage-side ground region is connected to at least one of the frame ground regions through a capacitance element having a capacitance of 10,000 pF or more.

According to the third aspect of the present invention, the frame ground regions are provided at a plurality of locations in the control board, and the high-voltage-side ground region is connected at least one of the frame ground regions through the capacitance element having a capacitance of 10,000 pF or more. Therefore, it is possible to ground the high-voltage-side ground region to at least one of the frame ground regions that are located at a plurality of locations through the capacitance element having a capacitance of 10,000 pF or more, to reduce the electromagnetic noise in the high-voltage-side ground region by readily pulling down the electromagnetic noise to the frame ground region that is located closest thereto, and to stabilize the high-voltage circuit in terms of noise. Therefore, it is possible to improve the EMC properties of the control board and to increase reliability, and at the same time, because the capacitance of the capacitance element connected to the frame ground region is 10,000 pF or more, it is possible to prevent a leakage current flowing towards the frame side.

Furthermore, an inverter device according to a fourth aspect of the present invention is an inverter device comprising any of the above-described control boards.

According to the fourth aspect of the present invention, the inverter device is an inverter device including any of the above-described control boards. Therefore, it is possible to reduce the electromagnetic noise output from the inverter device and to improve the electromagnetic noise immunity of the inverter device. Therefore, it is possible to prevent malfunction etc. of the inverter device due to noise interference and to improve the electromagnetic compatibility (EMC) of the inverter device, increasing its quality and reliability.

Furthermore, an integrated-inverter electric compressor according to a fifth aspect of the present invention is an integrated-inverter electric compressor in which an inverter device comprising any of the above-described control board is integrally built into a housing.

According to the fifth aspect of the present invention, the integrated-inverter electric compressor is an integrated-inverter electric compressor in which the inverter device including any of the above-described control boards is integrally built into a housing. Therefore, it is possible to reduce the electromagnetic noise output from the inverter device and to improve the electromagnetic noise immunity of the inverter device. Therefore, the electric compressor can be driven stably while preventing malfunction etc. of the inverter device due to the noise interference, and the electromagnetic compatibility (EMC) of the integrated-inverter electric compressor can be improved, increasing its quality and reliability.

Advantageous Effects of Invention

According to the control board of the present invention, it is possible to reduce the electromagnetic noise in various frequency bands that is input/output through a plurality of communication lines by pulling down the electromagnetic noise to the low-voltage-side ground region and the frame ground region through the capacitance element with various capacitances, and to stabilize the low-voltage circuit in terms of noise; therefore, it is possible to improve the electromagnetic compatibility (EMC; Electro-Magnetic Compatibility) of the control board and to increase the reliability against increasing complexity, intensity, etc. of generated noise and noise transmission routes due to the properties of the control board, size-reduction of the control board, an increase in the number of communication lines, and so forth.

In addition, according to the control board of the present invention, it is possible to ground the low-voltage-side ground region to the frame ground region through the capacitance element having a capacitance of 0.1 µF or more, to reduce mainly conductive noise by readily pulling down the electromagnetic noise entering the low-voltage-side ground region to the frame ground region, and to stabilize the low-voltage circuit in terms of noise; therefore, it is possible to improve the EMC properties of the control board and to increase reliability.

In addition, according to the control board of the present invention, it is possible to ground the high-voltage-side ground region to at least one of the frame ground regions that are located at a plurality of locations through the capacitance element having a capacitance of 10,000 pF or more, to reduce the electromagnetic noise in the high-voltage-side ground region by readily pulling down the electromagnetic noise to the frame ground region that is located closest thereto, and to stabilize the high-voltage circuit in terms of noise; therefore, it is possible to improve the EMC properties of the control board and to increase reliability.

In addition, according to the inverter device and the integrated-inverter electric compressor of the present invention, it is possible to reduce the electromagnetic noise that is output from the inverter device and to improve the electromagnetic noise immunity of the inverter device; therefore, it is possible to prevent malfunction etc. of the inverter device due to noise interference, to improve the electromagnetic compatibility (EMC) of the inverter device and the integrated-inverter electric compressor with a built-in inverter device, and to increase the quality and reliability thereof.

DESCRIPTION OF EMBODIMENT

An embodiment of the present invention will be described below with reference to FIGS. 1 to 4B.

Figure 1:
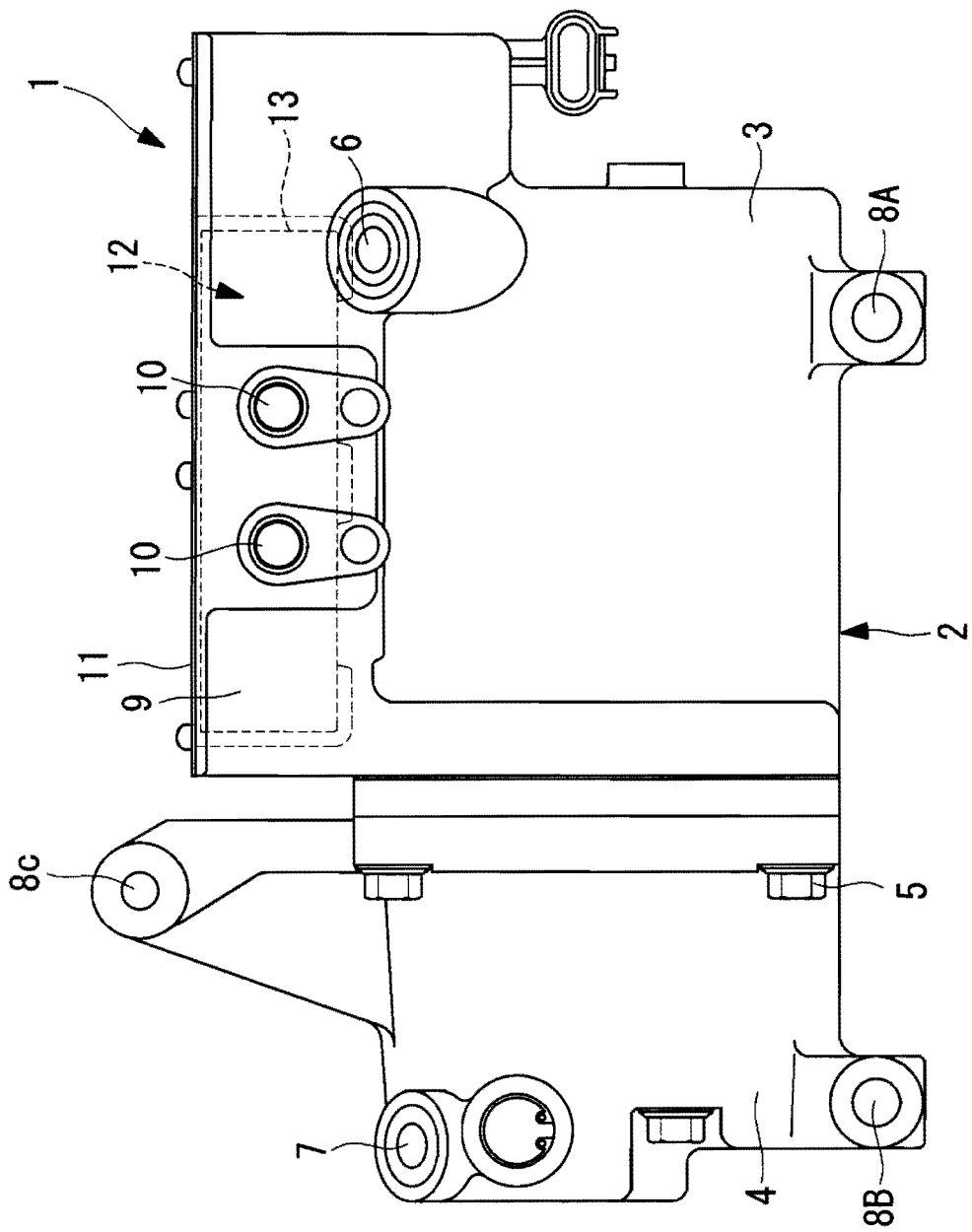
FIG. 1 is a side view of an integrated-inverter electric compressor according to one embodiment of the present invention.
Figure 2:
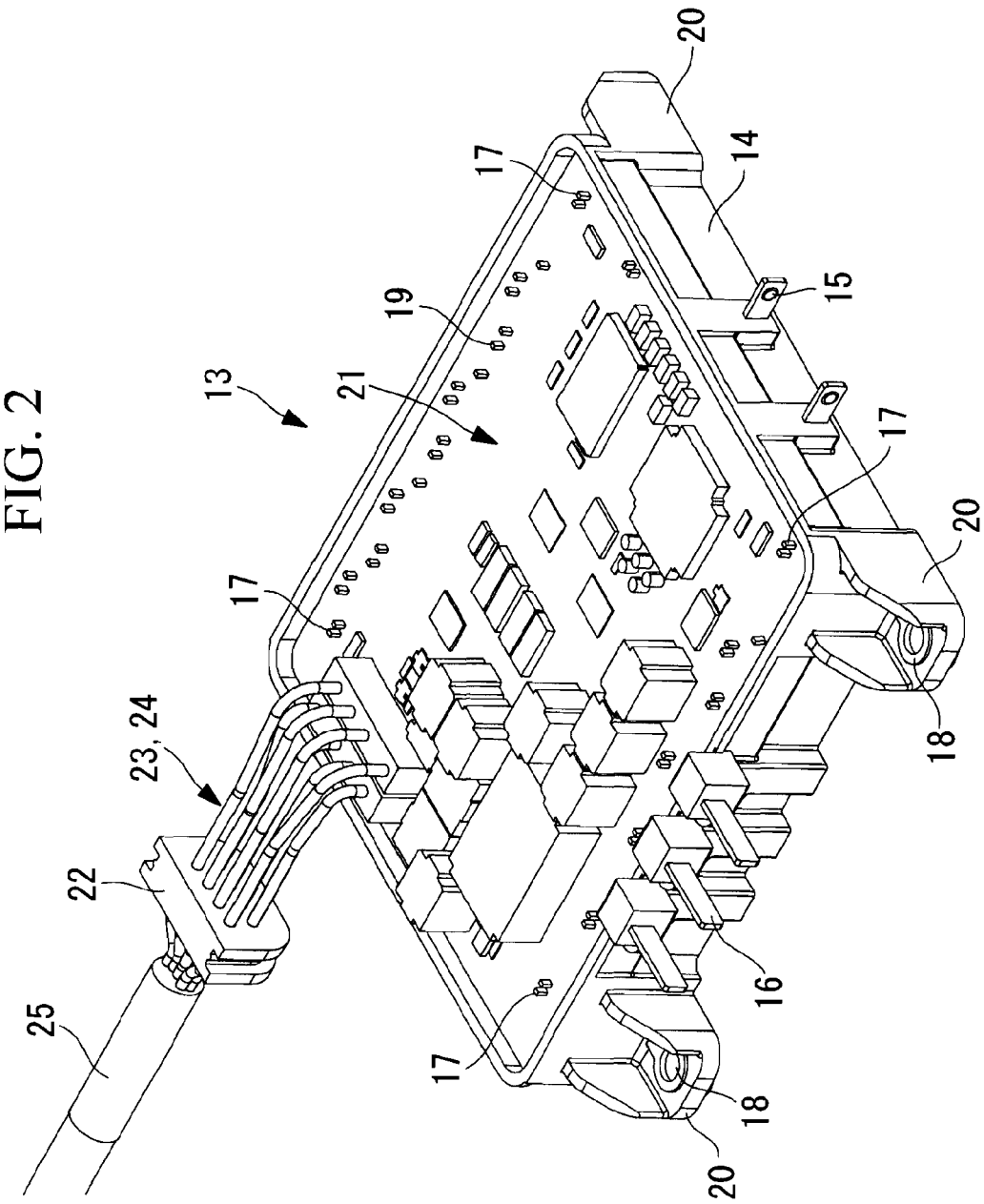
FIG. 2 is a perspective view of an inverter device (inverter module) that is integrally built into the integrated-inverter electric compressor of FIG. 1.
Figure 3:
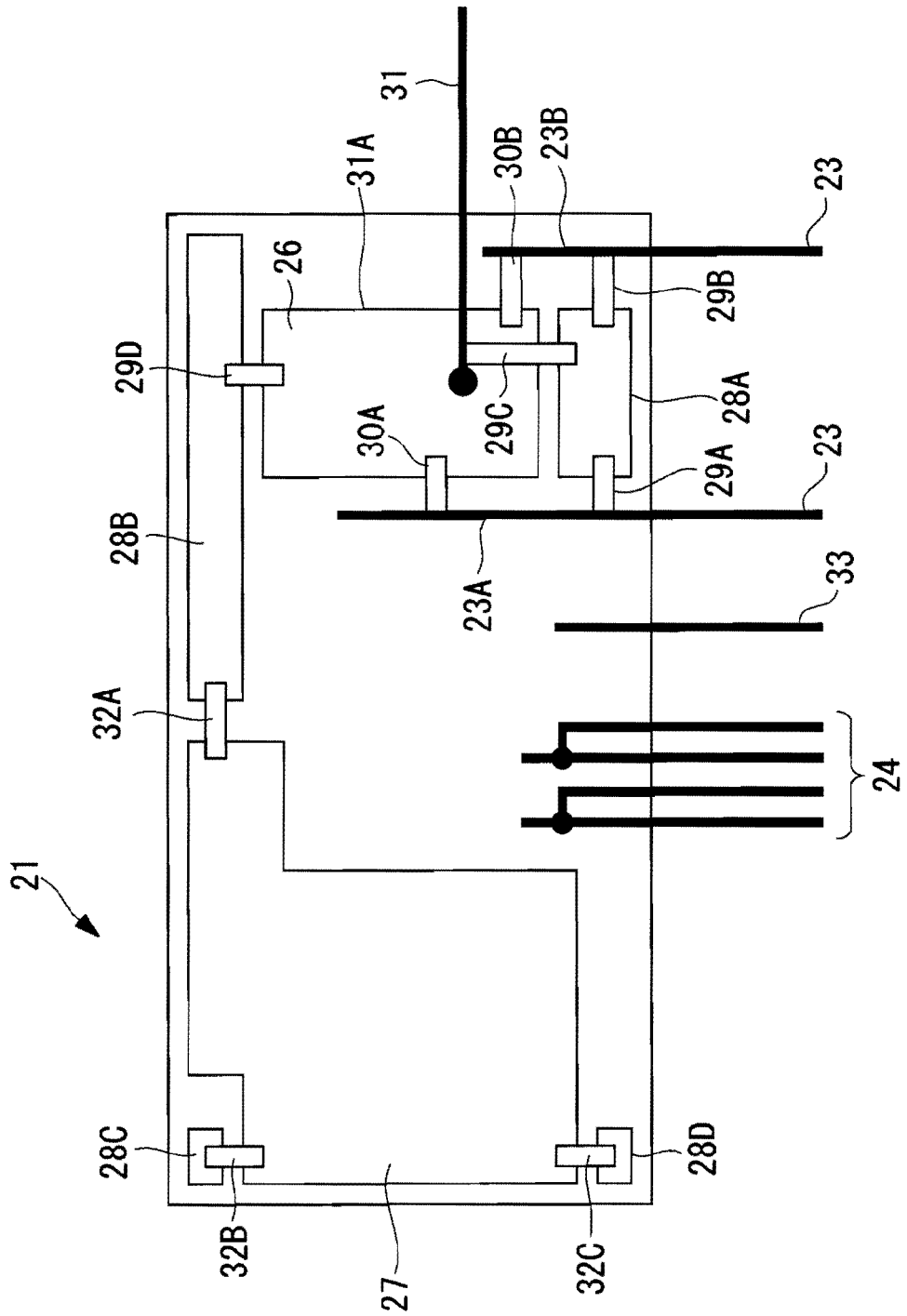
FIG. 3 is a schematic view of a control board used in the inverter device (inverter module) of FIG. 2.

A side view of an integrated-inverter electric compressor according to an embodiment of the present invention is shown in FIG. 1, a perspective view of an inverter device (inverter module) that is built in thereto is shown in FIG. 2, and a schematic view of a control board thereof is shown in FIG. 3.

An integrated-inverter electric compressor 1 is provided with a housing 2 that forms an outer shell. The housing 2 is constructed by integrally connecting a motor housing 3 that accommodates an electric motor (not shown) and a compressor housing 4 that accommodates a compressor mechanism (not shown) using bolts 5. The motor housing 3 and the compressor housing 4 are pressure-resistant containers formed of die-cast aluminum.

The electric motor and compressor mechanism (not shown) accommodated in the housing 2 are linked through a motor shaft, and the compressor mechanism is configured so as to be driven by the rotation of the electric motor. A coolant inlet port 6 is provided on one side (right-hand side in FIG. 1) of the motor housing 3, and low-temperature, low-pressure coolant gas sucked into the motor housing 3 through this coolant inlet port 6 flows around the electric motor along a motor-axis and is then sucked into and compressed by the compressor mechanism. After the high-temperature, high-pressure coolant gas that has been compressed by the compressor mechanism is discharged into the compressor housing 4, the coolant gas is discharged to the outside through an outlet port 7 provided on one side (left-hand side in FIG. 1) of the compressor housing 4.

In the housing 2, for example, attachment legs 8A, 8B, and 8C are provided at three positions in total: two positions at the lower part of one side (right-hand side in FIG. 1) of the motor housing 3 and the lower part of one side (left-hand side in FIG. 1) of the compressor housing 4, and one position at the upper part of the compressor housing 4. The integrated-inverter electric compressor 1 is mounted on a vehicle by fixedly installing these attachment legs 8A, 8B, and 8C onto the side wall etc. of a drive engine installed in an engine compartment of the vehicle using brackets and bolts.

An inverter accommodating portion 9 having a predetermined volume at its upper part is integrally formed on the outer periphery of the motor housing 3. This inverter accommodating portion 9 has a box-shape with an open top and a surrounding wall with a predetermined height, and two power-line guiding openings 10 are provided on the side surface thereof. The top surface of the inverter accommodating portion 9 can be closed tightly by fixing a cover member 11 thereto with screws.

An inverter device 12 that converts DC power supplied through two power lines from an on-board power unit (battery) (not shown) to three-phase AC power and applies the three-phase AC power to the built-in electric motor in the motor housing 3 to drive the electric motor is accommodated and installed in the inverter accommodating portion 9. The inverter device 12 is provided with an inverter module 13 (see FIG. 2), which is configured by forming a power board, a control board, and so forth as an integral module, and a noise-removing filter circuit (not shown) constituted of high-voltage parts, such as a capacitor (smoothing capacitor), an inductor coil, and so forth.

The inverter module 13 is provided with a rectangular plastic case 14 in which a power board (not shown) made of an aluminum sheet etc. is integrally insert molded to the bottom part. A switching circuit that is constituted of a semiconductor switching element such as an IGBT etc. is mounted on the power board. In addition to the power board, P-N terminals 15 to which the power lines are connected, U-V-W terminals 16 that supply three-phase AC power to the electric motor, earths 17 and earth terminals 18, numerous connecting terminals 19 that connect the power board and a control board 21, and so forth are integrally insert molded in the plastic case 14.

The plastic case 14 has a rectangular shape, and the P-N terminals 15 are provided so as to protrude from the one side along the side surface in which the power-line guiding openings 10 of the inverter accommodating portion 9 are formed, and the U-V-W terminals 16 are provided so as to protrude from the side that is adjacent to this side and close to the compressor housing 4. Fixing legs 20, which are fixed by screwing them to the bottom surface of the inverter accommodating portion 9 using bolts, are integrally molded on the four corners of the plastic case 14, respectively. The earth terminal 18 is formed on the fixing leg 20 in such a manner that a bolt can pass therethrough, and the earth terminal 18 is configured such that frame ground of the power board and the control board 21 are casing-grounded to the housing 2 by fixing the plastic case 14 onto the bottom surface of the inverter accommodating portion 9 using bolts.

The control board 21 is arranged at the upper part of the plastic case 14 so as to maintain a certain gap with respect to the power board, and the control board 21 is supported by the numerous connecting terminals 19, earths 17, and so forth. The control board 21 is provided with a low-voltage circuit for communication that operates at low voltage and a high-voltage circuit that controls AC power to be applied to the electric motor. In regions where the low-voltage circuit and the high-voltage circuit are provided, a low-voltage circuit pattern and a high-voltage circuit pattern are formed, and these respective regions are separated from each other by a predetermined insulation distance.

A control and communication line 25, which includes at least two communication lines 23 (lines for communicating with the vehicle and lines for waking up from sleep) and four CAN communication lines 24, is connected to the low-voltage circuit side of the above-described inverter module 13 by passing through the inverter accommodating portion 9 via gromet 22. DC power is supplied to the P-N terminals 15 with two power lines 33 (see FIG. 3) through the noise-removing filter circuit that is constituted of a capacitor (smoothing capacitor), an inductor coil, and so forth.

Furthermore, as shown in FIG. 3, a low-voltage-side ground region 26 and a high-voltage-side ground region 27 are formed in the control board 21 corresponding to the low-voltage circuit pattern and the high-voltage circuit pattern. Frame ground regions 28A, 28B, 28C, and 28D, which are connected to the earth terminals 18 through the earths 17 provided on the four corners of the plastic case 14, are formed at four locations corresponding to the four corners of the control board 21, respectively.

Respective communication line patterns 23A and 23B, to which two communication lines 23 are connected, are connected to the frame ground region 28A that is located closest to the connecting positions of the communication lines 23 through capacitance elements (capacitors) 29A and 29B, each of which has a capacitance of 0.1 µF or more, and the respective communication line patterns 23A and 23B are connected to a low-voltage-side ground region 26 through capacitance elements (capacitors) 30A and 30B, each of which has a capacitance of pF order (for example, 1 to 100 pF). A pattern 31A of a ground line 31 connected to the low-voltage-side ground region 26 is also connected to the frame ground region 28A that is located closest to the connecting positions thereof through a capacitance element (capacitor) 29C having a capacitance of 0.1 µF or more.

On the other hand, the low-voltage-side ground region 26 is connected to a frame ground region 28B, which is different from the frame ground region 28A to which two communication lines 23 are connected, through a capacitance element (capacitor) 29D having a capacitance of 0.1 µF or more. Furthermore, the high-voltage-side ground region 27 is connected to three frame ground regions 28B, 28C, and 28D through capacitance elements (capacitors) 32A, 32B, and 32C, each of which has a capacitance of 10,000 pF or more. Note that reference numeral 33 in FIG. 3 indicates a power line.

With the configuration described above, the following advantages and effects can be afforded by this embodiment.

In the above-described integrated-inverter electric compressor 1, DC power supplied to the inverter device 12 from the on-board power unit through a power line 33 is input to a switching circuit on the power board from the P-N terminals 15 of the inverter module 13 via the noise-removing filter circuit, is converted to three-phase AC power having an instructed frequency by the operation of a semiconductor switching element, which is controlled via the control board 21, and is then applied to the electric motor in the motor housing 3 from the U-V-W terminals 16 through a glass-sealed terminal (not shown).

As a result, the electric motor is rotationally driven at the instructed frequency to drive the compressor mechanism, thereby performing compression of the coolant. The inverter device 12 is controlled on the basis of an instruction input from an on-board ECU through the control and communication line 25, and the controlled state thereof is fed back to the on-board ECU. Because the inverter device 12 that is built into the housing 2 of the electric compressor 1 is connected to an external unit through the power line 33 and a plurality of control and communication lines 25, these lines serve as antennas to allow electromagnetic noise to be radiated from the outside. On the other hand, because a high-voltage electronic component, such as an IGBT etc., that performs a switching operation is built into the inverter device 12, the inverter device 12 itself serves as a radiation source for radiating electromagnetic noise.

Nevertheless, in this embodiment, in the control board 21 in which low-voltage circuits and high-voltage circuits are provided, because the low-voltage-side ground region 26 and the high-voltage-side ground region 27 are formed in correspondence with the respective circuits, and the frame ground regions 28A to 28D are provided on four locations at each corner of the control board 21, respectively, a plurality of communication line patterns 23A and 23B, which are connected to the low-voltage circuit, are connected to both the low-voltage-side ground region 26 and the frame ground region 28A through the capacitance elements 29A and 29B, and 30A and 30B having various capacitances, respectively.

Therefore, it is possible to stabilize the low-voltage circuit in terms of noise by reducing the electromagnetic noise in various frequency bands that is input/output through the plurality of communication lines 23 by pulling down the electromagnetic noise to the low-voltage-side ground region 26 and the frame ground region 28A through the capacitance elements 29A and 29B, and 30A and 30B having various capacitances. Thus, it is possible to improve the electromagnetic compatibility (EMC; Electro-Magnetic Compatibility) of the control board 21 and to increase the reliability against increasing complexity, intensity, etc. of generated noise and noise transmission routes due to the properties of the control board 21, size-reduction of the control board 21, an increase in the number of communication lines 23, and so forth.

Specifically, the capacitances of the capacitance elements 29A and 29B that are connected between the communication line patterns 23A and 23B and the frame ground region 28A are set to 0.1 µF or more, and the capacitances of the capacitance elements 30A and 30B that are connected between the communication line patterns 23A and 23B and the low-voltage-side ground region 26 are set to be on the order of pF (1 to 100 pF). Therefore, the conductive noise is mainly pulled down to the frame ground region 28A through the capacitance elements 29A and 29B that have a capacitance of 0.1 µF or more and that are connected to the frame ground region 28A, and the radiated noise is mainly pulled down to the low-voltage-side ground region 26 through the capacitance elements 30A and 30B that have a capacitance of pF order (1 to 100 pF) and that are connected to the low-voltage-side ground region 26; thereby, noise can be reduced in a wide frequency band. Therefore, the control board 21 can be made compliant with several noise tests, and it is possible to improve the EMC properties of the control board 21.

In this embodiment, because the communication line patterns 23A and 23B are connected to the frame ground region 28A that is located closest to the connecting positions of the communication lines 23 through the capacitance elements 29A and 29B, having a capacitance of 0.1 µF or more, it is possible to pull down the electromagnetic noise to the frame ground region 28A at a location closer to the generation source and to reduce the electromagnetic noise more effectively. Therefore, it is possible to further improve the EMC properties of the control board 21.

The ground line 31, which is connected to the low-voltage-side ground region 26, is connected to the frame ground region 28A, which is one of a plurality of the frame ground regions 28A to 28D, through the capacitance element 29C having a capacitance of 0.1 µF or more. Therefore, it is possible to reduce the electromagnetic noise that is input/output through the ground line 31 connected to the low-voltage-side ground region 26 by pulling down the electromagnetic noise to the frame ground region 28A through the capacitance element 29C, thereby improving the EMC properties of the control board 21.

Figure 4A:
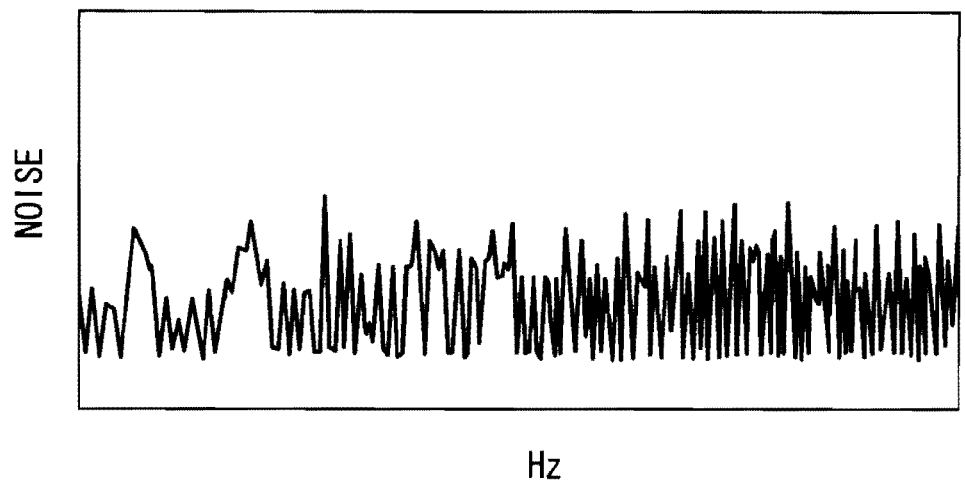
FIG. 4A is a graph of measurements before taking a countermeasure exhibiting a noise reduction effect according to the present invention.
Figure 4B:
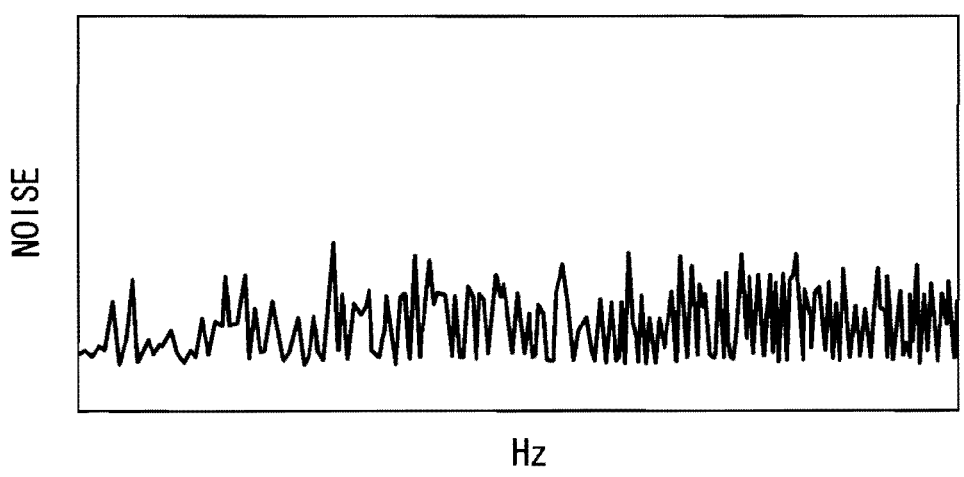
FIG. 4B is a graph of measurements after taking a countermeasure exhibiting a noise reduction effect according to the present invention.

In FIGS. 4A and 4B, the results of measuring the noise of the control board 21 obtained by providing the capacitance element 29C are shown. In comparison with FIG. 4A, which shows a graph before taking the countermeasure, it can be seen that the noise is reduced to a greater degree over substantially the entire region of a wide frequency band (the amplitude of the noise waveform is smaller over substantially the entire region of the frequency band) in the graph shown in FIG. 4B, obtained after the countermeasure of providing the capacitance element 29C, and it is understood that a considerable noise-reduction effect can be achieved.

In this embodiment, the configuration includes the low-voltage-side ground region 26 that is connected to the frame ground region 28B that is located closest thereto among a plurality of the frame ground regions 28A to 28D through the capacitance element 29D having a capacitance of 0.1 µF or more. Therefore, it is possible to ground the low-voltage-side ground region 26 to the frame ground region 28B through the capacitance element 29D having a capacitance of 0.1 μF or more, to reduce the electromagnetic noise in the low-voltage-side ground region 26 by readily pulling down the electromagnetic noise to the frame ground region 28B, and to stabilize the low-voltage circuit in terms of noise. Therefore, it is possible to improve the EMC properties of the control board 21 and to increase reliability.

Furthermore, in this embodiment, the high-voltage-side ground region 27 is connected to at least one of a plurality of the frame ground regions 28A to 28D (in this example, three frame ground regions 28B to 28D) through the capacitance elements 32A to 32C having a capacitance of 10,000 pF or more. Thus, it is possible to ground the high-voltage-side ground region 27 to at least one of the plurality of frame ground regions 28A to 28D through the capacitance elements 32A to 32C, each of which has a capacitance of 10,000 pF or more.

Therefore, it is possible to stabilize the high-voltage circuit in terms of noise by reducing the electromagnetic noise in the high-voltage-side ground region 27 by pulling down the electromagnetic noise to one of the frame ground regions 28B to 28D that is located closest thereto; by doing so, it is also possible to improve the EMC properties of the control board 21 and to increase reliability.

By employing the control board 21 mentioned above, it is possible to reduce the electromagnetic noise output from the inverter device 12 and to improve the electromagnetic noise immunity of the inverter device 12. Therefore, it is possible to prevent malfunction etc. of the inverter device 12 due to noise interference and to improve the electromagnetic compatibility (EMC) of the inverter device 12 to increase its quality and reliability. Similarly, because the integrated-inverter electric compressor 1 is configured by building the inverter device 12 into the inverter accommodating portion 9 of the housing 2, it is possible to reduce the electromagnetic noise output from the inverter device 12 and to improve the electromagnetic noise immunity of the inverter device. Therefore, while preventing malfunction of the inverter device 12 due to noise interference, the electric compressor 1 can be driven stably, and the electromagnetic compatibility (EMC) of the integrated-inverter electric compressor 1 can be improved to increase its quality and reliability.

The present invention is not limited to the invention according to the above-described embodiments, and appropriate modifications are permissible within a range that does not depart from the spirit thereof. For example, although example configurations of the inverter device 12 and the integrated-inverter electric compressor 1 into which the inverter device 12 is integrated are shown in the above-described embodiment, the configurations are not limited thereto, and it is needless to say that the present invention can be applied to various types of inverter devices and integrated-inverter electric compressors. In addition, the inverter device need not necessarily be formed as a module.

Furthermore, in the above-described embodiment, although the CAN communication lines 24 are not connected to the low-voltage-side ground region and the frame ground region through the capacitance element, it is also possible to connect the CAN communication lines 24 to the low-voltage-side ground region and the frame ground region through capacitance elements as required. However, because there is a risk that connecting a capacitance element may cause signal distortion, the decision may be made by taking this issue into consideration.

REFERENCE SIGNS LIST 1 integrated-inverter electric compressor
2 housing
9 inverter accommodating portion
12 inverter device
13 inverter module
21 control board
23 communication line
23A, 23B communication line pattern
24 CAN communication line
25 control and communication line
26 low-voltage-side ground region
27 high-voltage-side ground region
28A, 28B, 28C, 28D frame ground region
29A, 29B, 29C, 29D capacitance element (capacitance is 0.1 μF or more)
30A, 30B capacitance element (capacitance is pF order)
31 ground line
32A, 32B, 32C capacitance element (capacitance is 10,000 pF or more)
33 power line

The invention claimed is:

1. A control board to which a low-voltage power system and a high-voltage power system, are inputs, comprising a low-voltage circuit and a high-voltage circuit, and a low-voltage-side ground region and a high-voltage-side ground region that are formed in correspondence with the low-voltage and high-voltage circuits, respectively,
   wherein frame ground regions are provided at a plurality of positions on the control board,
   a plurality of communication line patterns connected to the low-voltage circuit are respectively connected to both the low-voltage-side ground region and the frame ground regions through capacitance elements with various capacitances, and
   wherein the capacitance elements that are connected between the plurality of communication line patterns and the frame ground regions have capacitances of 0.1 μF or more, and the capacitance elements that are connected between the communication line patterns and the low-voltage-side ground region have capacitances on the order of pFs.

2. A control board according to claim 1, wherein the low-voltage-side ground region is connected to one of the frame ground regions through a first capacitance element having a capacitance of 0.1 μF or more.

3. A control board according to claim 2, wherein the low-voltage-side ground region is connected to the one frame ground region that is located closest to that low-voltage-side ground region through the first capacitance element.

4. A control board according to claim 1, wherein the high-voltage-side ground region is connected to at least one of the frame ground regions through other capacitance elements having a capacitance of 10,000 pF or more.

5. A control board according to claim 4, wherein the high-voltage-side ground region is connected to the at least one frame ground regions that is located closest to that high-voltage-side ground region through one of the other capacitance elements.

6. A control board to which a low-voltage power system and a high-voltage power system, are inputs, comprising a low-voltage circuit and a high-voltage circuit, and a low-voltage-side ground region and a high-voltage-side ground region that are formed in correspondence with the low-voltage and high-voltage circuits, respectively,
   wherein frame ground regions are provided at a plurality of positions on the control board,
   wherein a plurality of communication line patterns connected to the low-voltage circuit are respectively connected to both the low-voltage-side ground region and the frame ground regions through capacitance elements with various capacitances, and wherein the plurality of the communication line patterns are connected to one of the frame ground regions that is located closest to connecting positions of the communication lines through the capacitance elements.

7. A control board according to claim 6, wherein the low-voltage-side ground region is connected to the one frame ground region through a first capacitance element having a capacitance of 0.1 µF or more.

8. A control board according to claim 7, wherein the low-voltage-side ground region is connected to the one frame ground region that is located closest to that low-voltage-side ground region through the first capacitance element.

9. A control board according to claim 6, wherein the high-voltage-side ground region is connected to at least another one of the frame ground regions through other capacitance elements having a capacitance of 10,000 pF or more.

10. A control board according to claim 9, wherein the high-voltage-side ground region is connected to the at least another one ground regions that is located closest to that high-voltage-side ground region through one of the other capacitance elements.

11. A control board to which a low-voltage power system and a high-voltage power system, are inputs, comprising a low-voltage circuit and a high-voltage circuit, and a low-voltage-side ground region and a high-voltage-side ground region that are formed in correspondence with the low-voltage and high-voltage circuits, respectively, wherein frame ground regions are provided at a plurality of positions on the control board, a plurality of communication line patterns connected to the low-voltage circuit are respectively connected to both the low-voltage-side ground region and the frame ground regions through capacitance elements with various capacitances, and wherein a ground line is connected to the low-voltage-side ground region, and the ground line is connected to one of the frame ground regions through a first capacitance element having a capacitance of 0.1 µF or more.

12. A control board according to claim 11, wherein the high-voltage-side ground region is connected to at least another one of the frame ground regions through further capacitance elements having a capacitance of 10,000 pF or more.

13. A control board according to claim 12, wherein the high-voltage-side ground region is connected to the at least another one ground regions that is located closest to that high-voltage-side ground region through one of the further capacitance elements.

14. A control board according to claim 11, wherein the low-voltage-side ground region is connected to the one frame ground region through a second capacitance element having a capacitance of 0.1 µF or more.

15. A control board according to claim 14, wherein the low-voltage-side ground region is connected to the one frame ground region that is located closest to that low-voltage-side ground region through the second capacitance element.

16. An inverter device comprising the control board according to any one of claims 1, 6 to 5.

17. An integrated-inverter electric compressor in which an inverter device comprising the control board according to any one of claims 1, 6 to 5 is integrally built into a housing.

18. An inverter device comprising the control board according to any one of claims 7 to 13.

19. An integrated-inverter electric compressor in which an inverter device comprising the control board according to any one of claims 7 to 13 is integrally built into a housing.

* * * * *